United States Patent
Ghyselen

(10) Patent No.: US 11,939,214 B2
(45) Date of Patent: Mar. 26, 2024

(54) METHOD FOR MANUFACTURING A DEVICE COMPRISING A MEMBRANE EXTENDING OVER A CAVITY

(71) Applicant: Soitec, Bernin (FR)

(72) Inventor: Bruno Ghyselen, Seyssinet (FR)

(73) Assignee: Soitec, Bernin (FR)

( * ) Notice: Subject to any disclaimer, the term of this patent is extended or adjusted under 35 U.S.C. 154(b) by 189 days.

(21) Appl. No.: 17/416,395

(22) PCT Filed: Dec. 12, 2019

(86) PCT No.: PCT/FR2019/053039
§ 371 (c)(1),
(2) Date: Jun. 18, 2021

(87) PCT Pub. No.: WO2020/128245
PCT Pub. Date: Jun. 25, 2020

(65) Prior Publication Data
US 2021/0387853 A1  Dec. 16, 2021

(30) Foreign Application Priority Data
Dec. 20, 2018 (FR) ........................ 1873602

(51) Int. Cl.
*B81C 1/00* (2006.01)
(52) U.S. Cl.
CPC .. *B81C 1/00158* (2013.01); *B81B 2203/0127* (2013.01); *B81B 2203/0315* (2013.01)
(58) Field of Classification Search
CPC ........ B81C 1/00158; B81B 2203/0127; B81B 2203/0315
See application file for complete search history.

(56) References Cited

U.S. PATENT DOCUMENTS

| 2002/0051258 A1* | 5/2002 | Tamura | ................. B81B 7/0041 358/514 |
| 2008/0136000 A1* | 6/2008 | Fischer | ................. B81B 7/0041 257/E23.128 |

(Continued)

FOREIGN PATENT DOCUMENTS

| EP | 2573514 B1 | 7/2015 |
| EP | 2969479 A1 | 1/2016 |

(Continued)

OTHER PUBLICATIONS

Taiwanese Office Action for Application No. 108145514 dated Nov. 14, 2022, 3 pages.

(Continued)

*Primary Examiner* — Omar F Mojaddedi
(74) *Attorney, Agent, or Firm* — TraskBritt

(57) ABSTRACT

A method for manufacturing a device comprising a membrane extending over a useful cavity, the method comprising: providing a generic structure comprising a surface layer extending in a main plane and arranged on a first face of a support substrate, the support substrate comprising elementary cavities opening under the surface layer and partitions delimiting each elementary cavity, the partitions having top surfaces that form all or part of the first face of the support substrate; defining a group of adjacent elementary cavities, such that a contour of the group of elementary cavities corresponds, in the main plane, to a contour of the useful cavity; and removing the partitions situated within the contour of the group of elementary cavities, in order to form the useful cavity, and to free the surface layer arranged above the useful cavity and forming the membrane.

20 Claims, 10 Drawing Sheets

(56) References Cited

U.S. PATENT DOCUMENTS

| | | | |
|---|---|---|---|
| 2011/0048129 A1* | 3/2011 | Yamanaka | B81C 1/00293 |
| | | | 156/60 |
| 2013/0068020 A1* | 3/2013 | Aono | B81C 1/00293 |
| | | | 29/841 |
| 2016/0023208 A1* | 1/2016 | Fisher | B81C 1/00071 |
| | | | 156/272.8 |
| 2017/0167999 A1 | 6/2017 | Akasaka | |
| 2018/0022601 A1* | 1/2018 | Waechter | B81C 1/00888 |
| | | | 257/414 |
| 2018/0195950 A1* | 7/2018 | Tsay | B01J 19/0046 |

FOREIGN PATENT DOCUMENTS

| | | |
|---|---|---|
| JP | 2005-303325 A | 10/2005 |
| TW | 201830604 A | 8/2018 |
| WO | 2014/142841 | 9/2014 |

OTHER PUBLICATIONS

International Search Report for International Application No. PCT/FR2019/053039 dated Mar. 19, 2020, 2 pages.
International Written Opinion for International Application No. PCT/FR2019/053039 dated Mar. 19, 2020, 5 pages.
Yipeng Lu et al., Modeling, Fabricating, and Characterization of Piezoelectric Micromachined, Journal of Microelectromechanical Systems, (Jan. 2015), 9 pages.
European Communication pursuant to Article 94(3) EPC for European Application No. 19842391, dated Feb. 6, 2024, 5 pages.

\* cited by examiner

[Fig. 1a]
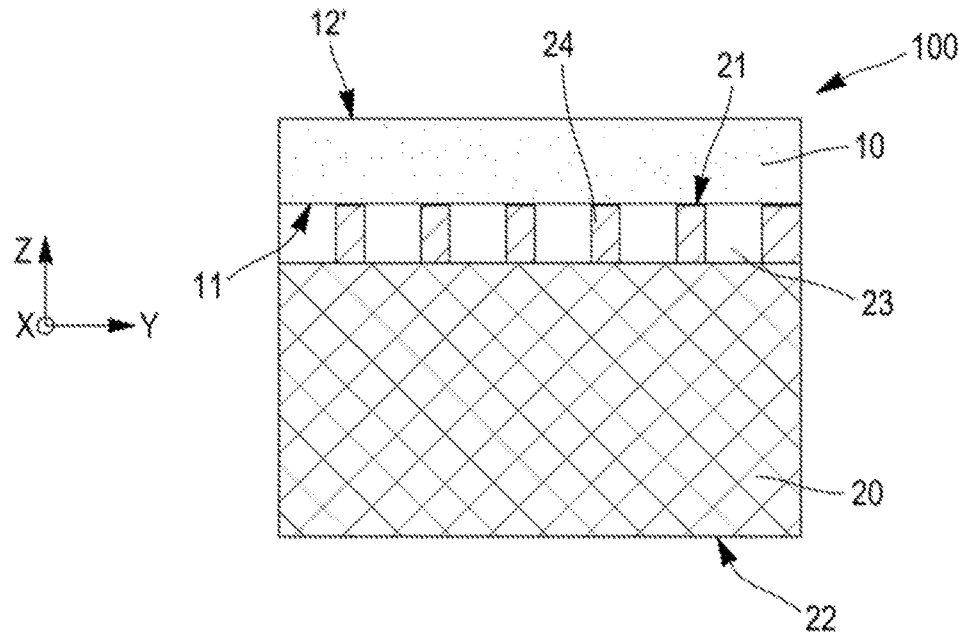
[Fig. 1b]
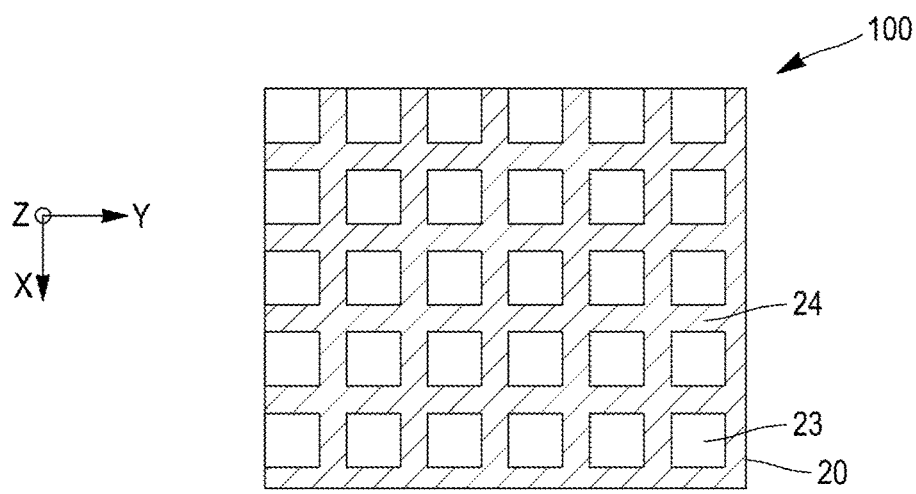
[Fig. 1c]
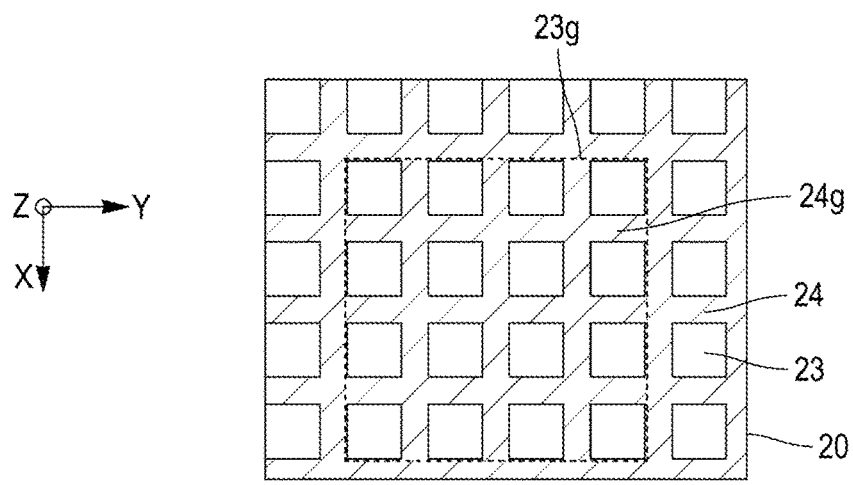

[Fig. 1d]
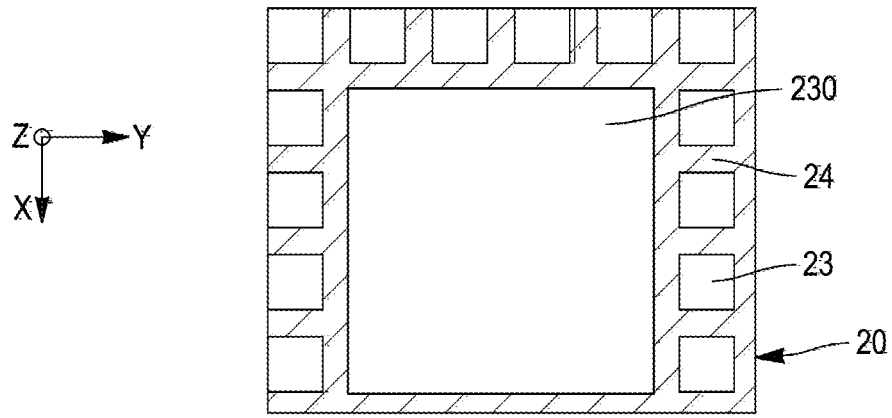
[Fig. 1e]
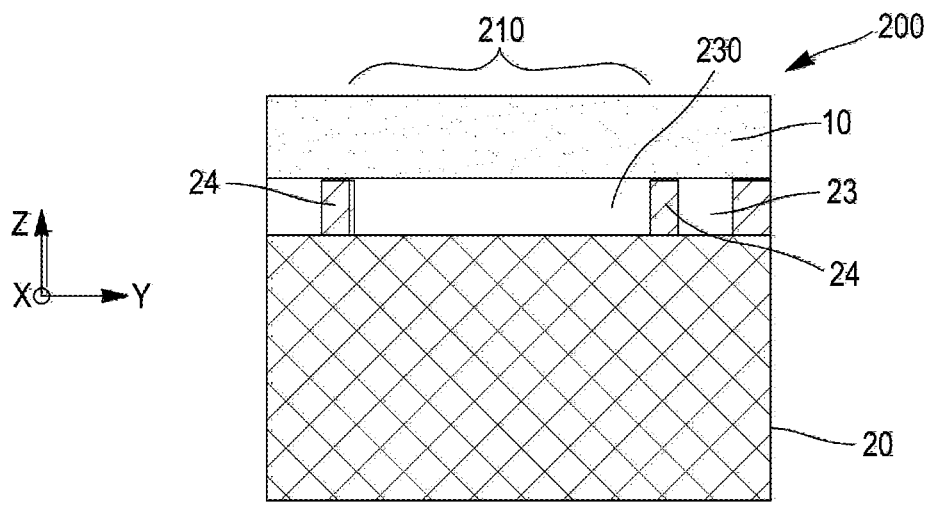
[Fig. 1f]
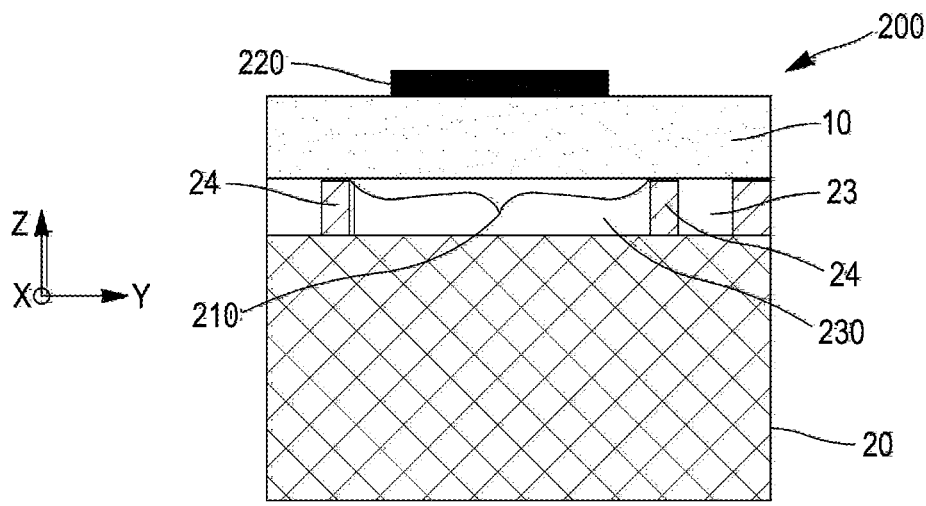

[Fig. 2a]
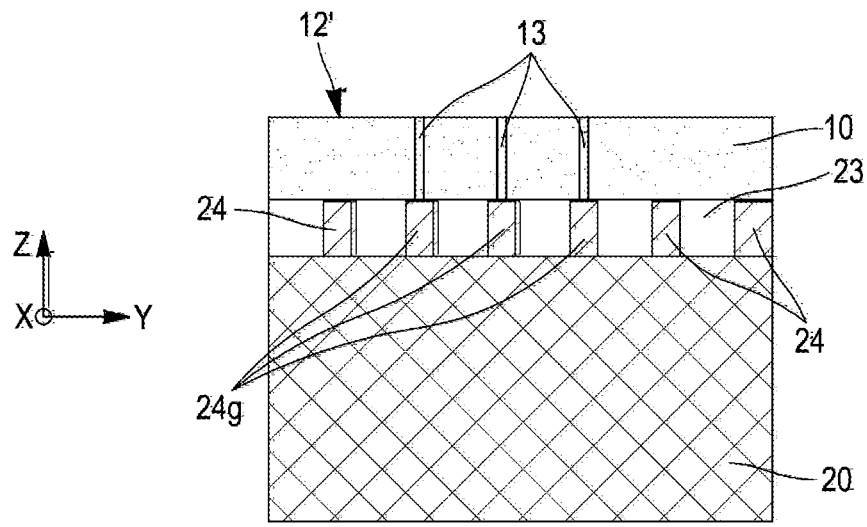
[Fig. 2b]
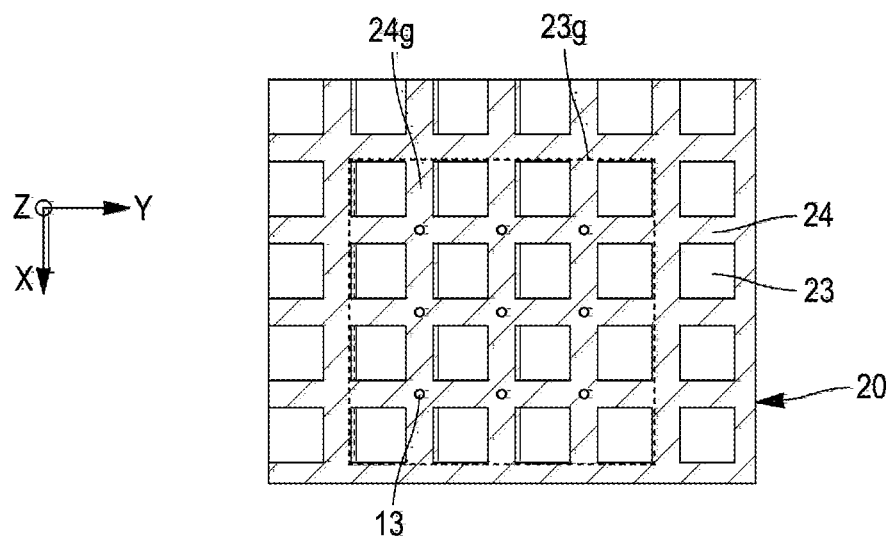

[Fig. 3a]
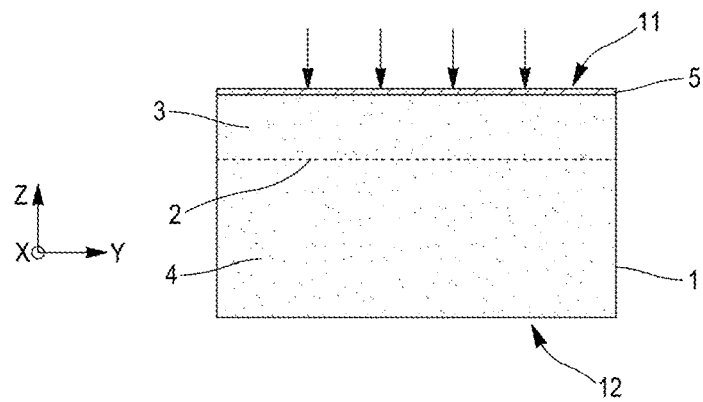
[Fig. 3b]
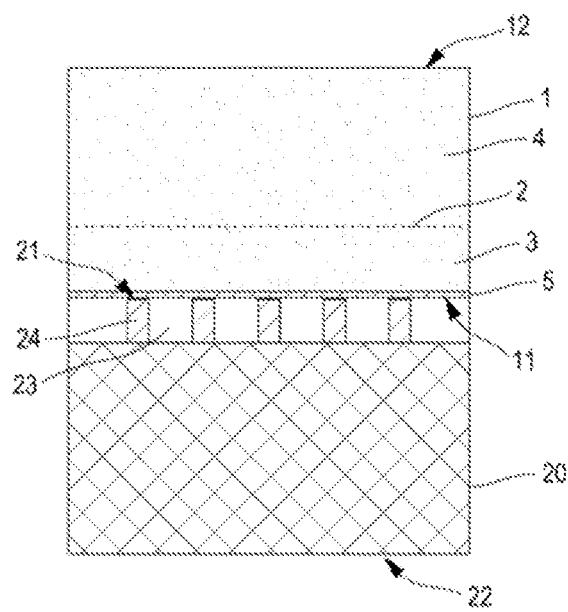
[Fig. 3c]
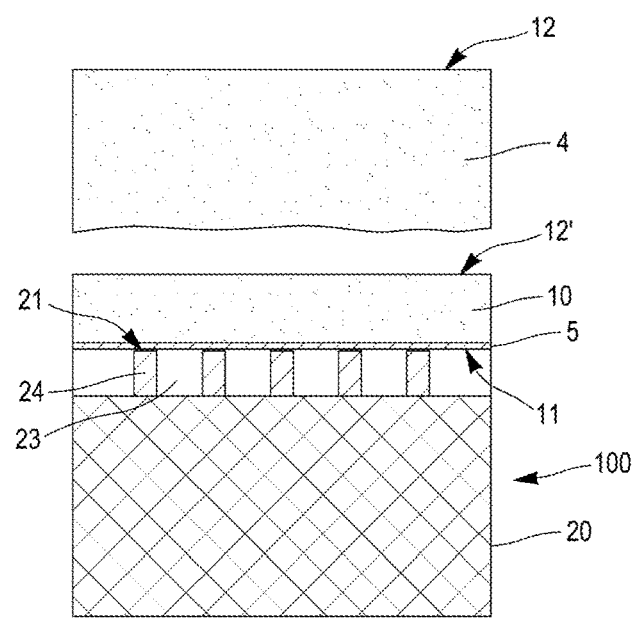

[Fig. 4a]
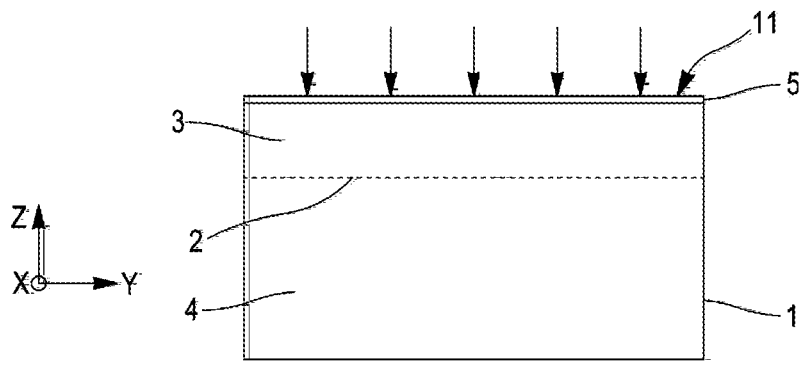
[Fig. 4b]
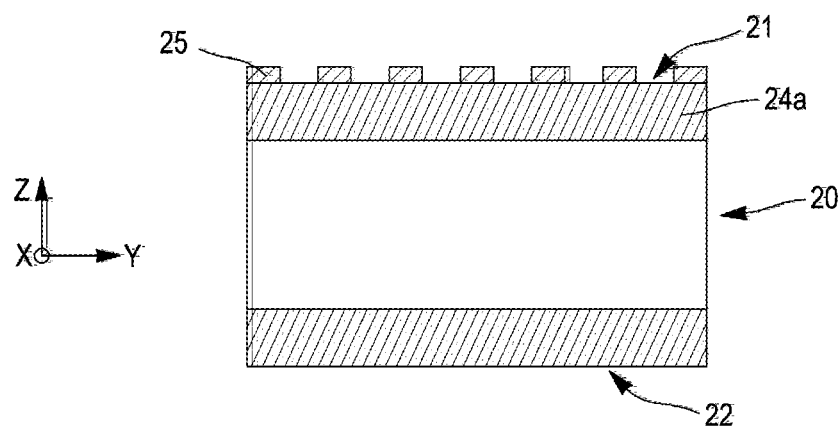
[Fig. 4c]
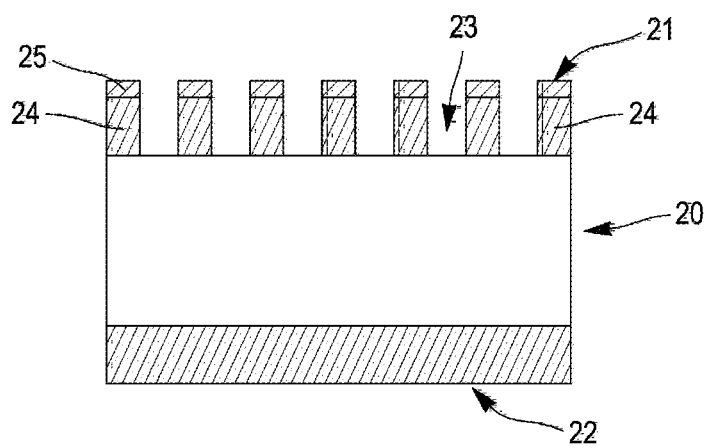

[Fig. 4d]
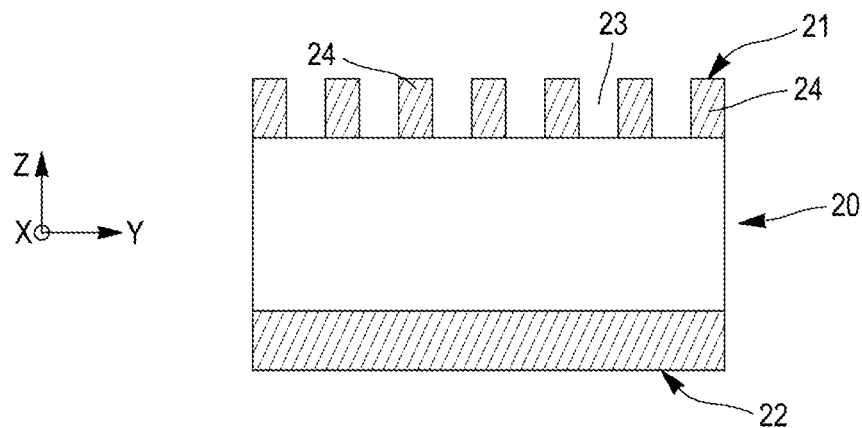
[Fig. 4e]
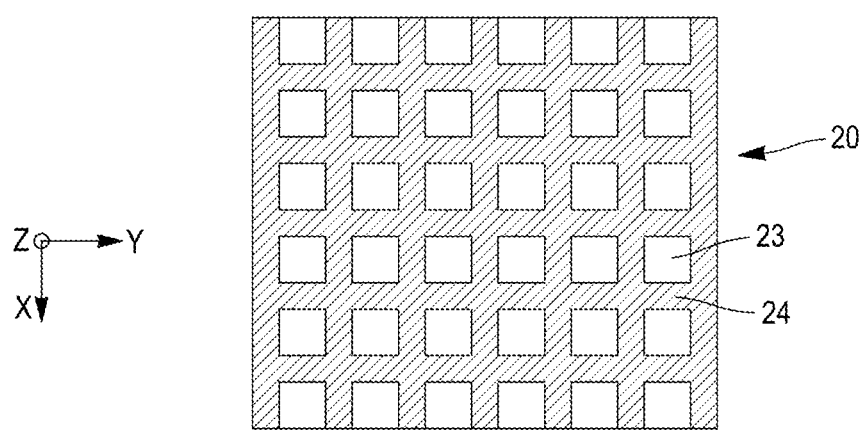
[Fig. 4f]
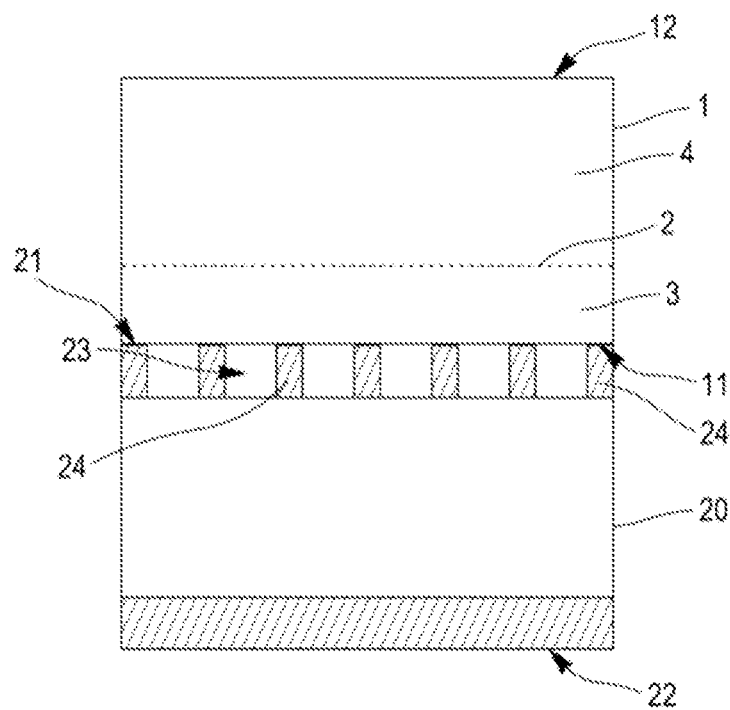

[Fig. 4g]
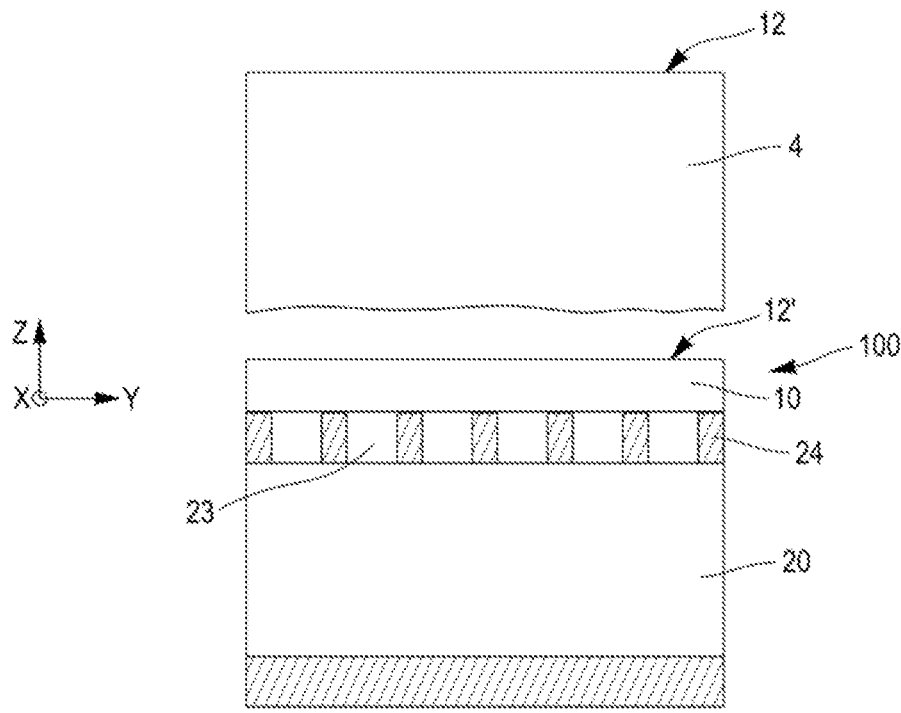
[Fig. 4h]
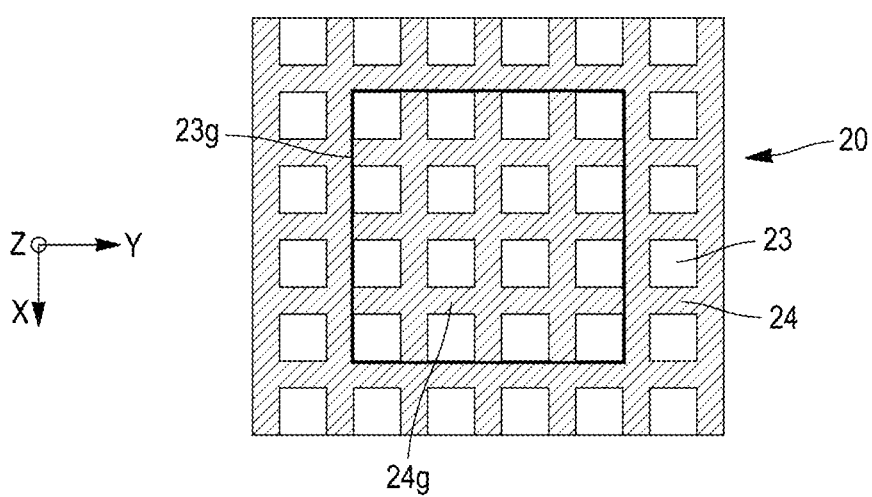

[Fig. 4i]
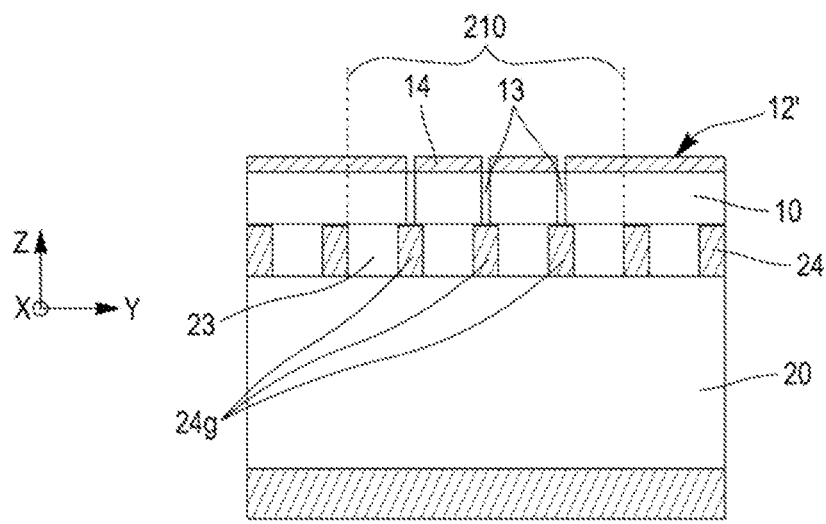
[Fig. 4j]
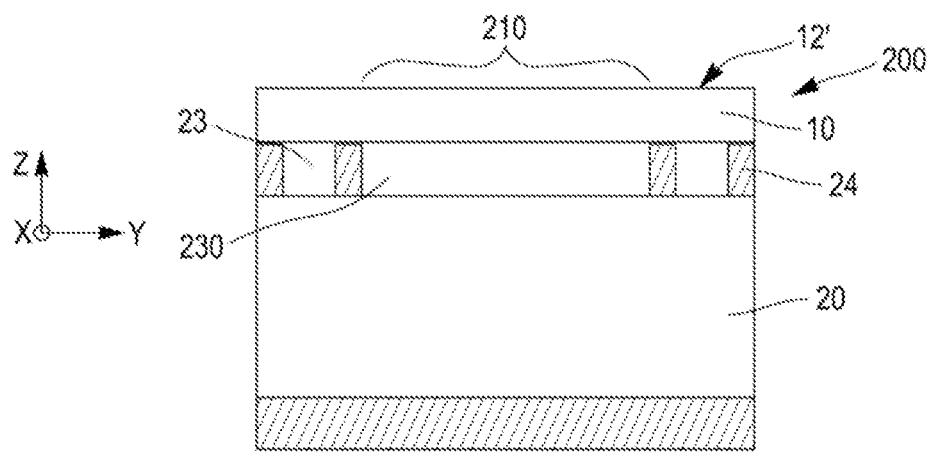

[Fig. 5a]
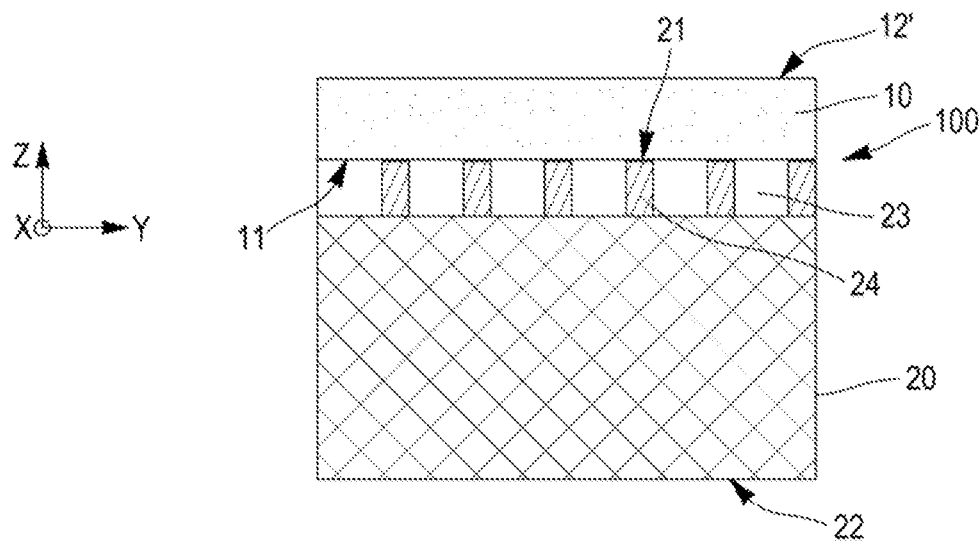
[Fig. 5b]
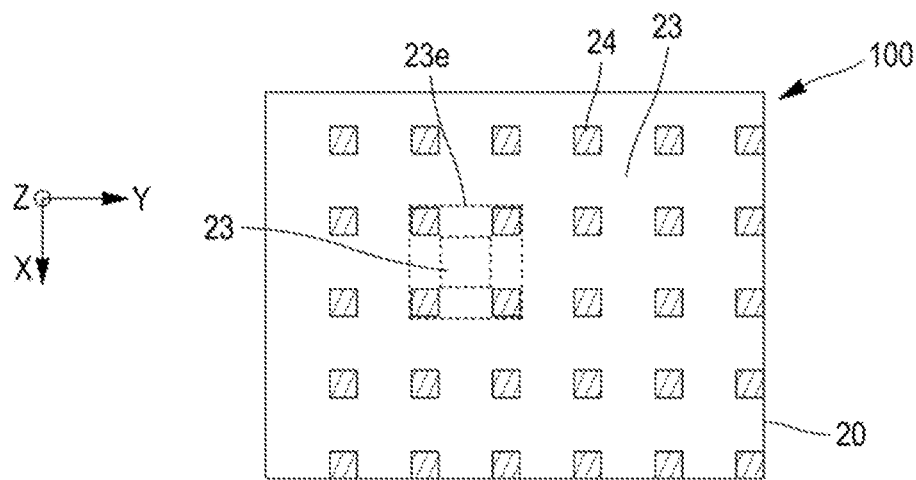
[Fig. 5c]
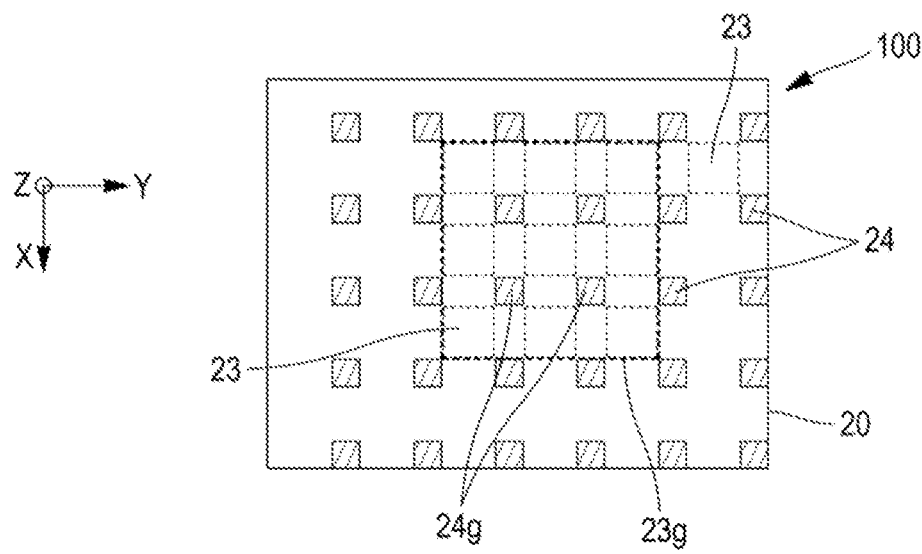

[Fig. 5d]
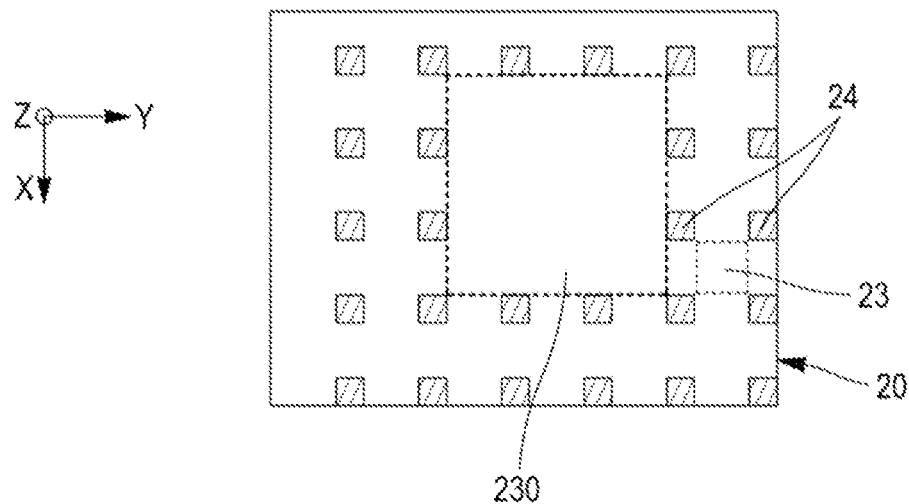
[Fig. 5e]
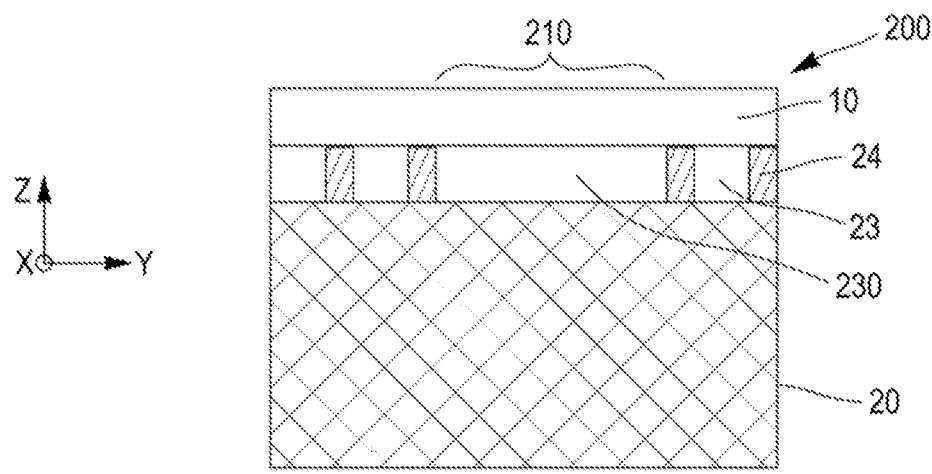

METHOD FOR MANUFACTURING A DEVICE COMPRISING A MEMBRANE EXTENDING OVER A CAVITY

CROSS-REFERENCE TO RELATED APPLICATIONS

This application is a national phase entry under 35 U.S.C. § 371 of International Patent Application PCT/FR2019/053039, filed Dec. 12, 2019, designating the United States of America and published as International Patent Publication WO 2020/128245 A1 on Jun. 25, 2020, which claims the benefit under Article 8 of the Patent Cooperation Treaty to French Patent Application Serial No. 1873602, filed Dec. 20, 2018.

TECHNICAL FIELD

The present disclosure relates to the field of microelectronics and microsystems. In particular, it relates to a process of fabricating a device comprising a membrane overhanging a useful cavity.

BACKGROUND

MEMS devices (MEMS being the acronym of microelectromechanical systems) are widely used to fabricate various sensors, for a multitude of applications: mention may, for example, be made of pressure sensors, microphones, radio-frequency switches, electro-acoustic and ultrasonic transducers (piezoelectric micromachined ultrasonic transducers (pMUT) for example), etc.

Many of these MEMS devices are based on a flexible membrane overhanging a useful cavity. In operation, the bowing of the membrane, which is related to a physical parameter (for example, the propagation of an acoustic wave for a pMUT), is converted into an electrical signal (or vice versa, depending on whether the device is in receiver or emitter mode).

Depending on the type of device implemented, the geometry of each useful cavity (shape, lateral dimensions, depth), of the membrane (thickness) and their planar distribution (inter-cavity distance) will be different.

The publication by Lu Yipeng and David A. Horsley, "Modeling, fabrication, and characterization of piezoelectric micromachined ultrasonic transducer arrays based on cavity SOI wafers" (*Journal of Microelectromechanical Systems* 24.4 (2015) 1142-1149), presents an example of fabrication of a pMUT device from an SOI (silicon-on-insulator) substrate having buried useful cavities. This process takes advantage of useful cavities formed beforehand in a substrate to limit the number of levels of photolithographic masks needing to be employed.

This approach is attractive, but it means that some of the effort made designing the acoustic device must be borne by the manufacturer of the substrate. Specifically, the manufacturer of the substrate must be able to design and fabricate a substrate including useful cavities conforming precisely to the topology (geometry of the cavities, inter-cavity spacing) required for the device. However, device topology is often a piece of valuable and sensitive information that the device manufacturer generally does not want to divulge.

In addition, the substrate manufacturer must develop substrate-fabricating processes specific to each topology. The effort required to do this makes rapid and economical development of the device more difficult.

It would, therefore, be desirable to be able to provide a substrate that can be used to fabricate a wide range of devices based on a membrane overhanging a useful cavity, and which would therefore not require the ad hoc development, for each device, of a substrate-specific fabricating process.

BRIEF SUMMARY

The purpose of the present disclosure is to achieve the aforementioned aim. It relates to a process of fabricating a device comprising a membrane overhanging a useful cavity, which is simplified due to the use of a generic substrate.

The disclosure relates to a process of fabricating a device including a membrane overhanging a useful cavity, the process comprising:
  providing a generic structure including a superficial layer extending in a main plane and arranged on a first side of a carrier substrate, the carrier substrate including elementary cavities opening under the superficial layer and partitions delimiting each elementary cavity, upper surfaces of the partitions forming all or some of the first side of the carrier substrate;
  defining a group of adjacent elementary cavities, such that a contour of the group of elementary cavities corresponds, in the main plane, to a contour of the useful cavity;
  removing the partitions located inside the contour of the group of elementary cavities, in order to form the useful cavity, and in order to free up the superficial layer arranged above the useful cavity and making up the membrane.

According to other advantageous and non-limiting features of the disclosure, taken alone or in any technically feasible combinations:
  the partitions separate the elementary cavities from one another;
  the partitions are distributed in the main plane according to a network of partitions allowing communication between the elementary cavities, each elementary cavity being delimited by an elementary pattern of the network of partitions;
  providing the generic structure comprises:
    providing a donor substrate,
    providing the carrier substrate including the opening elementary cavities and the partitions delimiting each elementary cavity and the upper surfaces of which form all or some of the first side of the carrier substrate,
    joining the donor substrate and the carrier substrate at the first side of the carrier substrate,
    thinning the donor substrate so as to form the superficial layer;
  providing the donor substrate comprises implanting light species in the donor substrate, so as to form a buried fragile region that lies between a first portion of the donor substrate, which portion is intended to form the superficial layer, and a second portion of the donor substrate, which portion is intended to form the rest of the donor substrate;
  thinning the donor substrate comprises separating, via the buried fragile region, the superficial layer from the rest of the donor substrate;
  the first portion of the donor substrate has a thickness between 0.2 micron and 2 microns;

the joining comprises bonding via molecular adhesion, on the one hand, the donor substrate, and, on the other hand, the first side of the carrier substrate;

removing the partitions located inside the contour of the group of elementary cavities comprises the local etching of the superficial layer in order to form at least one aperture passing through the superficial layer, and the chemical etching of the partitions via the aperture;

the at least one aperture is made plumb with the partitions;

an aperture is made plumb with each elementary cavity of the group of elementary cavities;

removing the partitions located inside the contour of the group of elementary cavities comprises the local etching of a second side of the carrier substrate in order to form at least one aperture opening into one of the cavities of the group of elementary cavities, and the chemical etching of the partitions via the aperture;

the partitions comprise at least one material chosen from silicon oxide, silicon nitride, single-crystal silicon, polycrystalline silicon, amorphous silicon or porous silicon;

the donor substrate comprises at least one semiconductor or piezoelectric material.

BRIEF DESCRIPTION OF THE DRAWINGS

Other features and advantages of the disclosure will become apparent from the following detailed description of the disclosure, which description is given with reference to the accompanying figures, in which:

FIGS. 1A to 1F show a process of fabricating a device comprising a membrane arranged on a useful cavity, in accordance with the disclosure;

FIGS. 2A and 2B show steps of a fabricating process according to the disclosure;

FIGS. 3A to 3C show other steps of a fabricating process according to the disclosure;

FIGS. 4A to 4J show an example of an embodiment of the fabricating process according to the disclosure;

FIGS. 5A to 5E show steps of a fabricating process according to the disclosure.

DETAILED DESCRIPTION

In the description, the same references in the figures might be used for elements of the same type. The figures are schematic representations which, for the sake of legibility, are not to scale. In particular, the thicknesses of the layers along the z-axis are not to scale with respect to the lateral dimensions along the x- and y-axes; and the relative thicknesses of the layers with respect to one another are not necessarily illustrated to scale in the figures.

The disclosure relates to a process of fabricating a device 200 including a membrane 210 overhanging a useful cavity 230 (FIGS. 1E and 1F). For example, the device 200 can comprise an ultrasonic or acoustic transducer.

The fabricating process according to the disclosure firstly comprises a step of providing a generic structure 100 including a superficial layer 10 extending in a main plane (x, y) and arranged on a first side 21 of a carrier substrate 20. The carrier substrate 20 includes elementary cavities 23 opening under the superficial layer 10 and partitions 24 normal to the main plane (x, y), delimiting each elementary cavity 23 (FIGS. 1A and 5A). The upper surfaces of the partitions 24 at least partly form the first side 21 of the carrier substrate 20.

By way of example, and in a non-limiting manner, the partitions 24 comprise at least one material from silicon oxide, silicon nitride, single-crystal silicon, polycrystalline silicon, amorphous silicon or porous silicon.

According to a first advantageous embodiment, the partitions 24 completely separate the elementary cavities 23 from one another. As illustrated in plan view in FIG. 1B, the partitions 24 advantageously form partitions organized in a grid in the main plane (x, y) making it possible to separate each elementary cavity 23 from the neighboring cavities thereof and therefore delimit each elementary cavity 23.

The elementary cavities 23 are, in this case, represented as being square-shaped, but alternatively they could have a rectangular, circular or any other geometric shape.

According to a second embodiment of the disclosure, the elementary cavities 23 are not separated from one another. The partitions 24 are distributed, preferentially in a uniform manner, in the main plane (x, y), according to a network of partitions 24, like the example illustrated in FIG. 5B. None of the partitions 24 mutually meet and they form local partitions and/or pillars. In this embodiment, an elementary cavity 23 refers to the cavity inside an elementary pattern 23e of the network of partitions 24. In the example of FIG. 5B, the elementary pattern 23e corresponds to a square pattern fictitiously defined by four adjacent partitions 24; the elementary cavity 23 is delimited by the four adjacent partitions 24 and corresponds to the interior region of this elementary pattern 23e.

The upper surface (in the main plane (x, Y)) of a partition 24 is represented in this case as being square-shaped, but it could have a rectangular, circular or any other geometric shape. The partitions 24 could also be distributed according to a grid network or another uniform distribution. By way of example, and in a non-limiting manner, the dimensions of a partition 24 in the main plane (x, y) can be approximately 5 microns, 7 microns, 10 microns or 15 microns.

The manufacturing process then comprises a step for defining a group 23g of adjacent elementary cavities 23, the outer contour of which, in the main plane (x, y), corresponds to a contour of the useful cavity 230 (FIGS. 1C and 5C). Of course, reference is made in this case to the definition of at least one group 23g of elementary cavities: indeed, in the case of a generic structure 100 formed from a carrier substrate 20 with a diameter of between 100 mm and 300 mm, a plurality of groups 23g will be defined, according to a determined distribution, in the main plane (x, y).

This defining step depends on the type of intended device 200, and, in particular, it depends on the required lateral dimensions of the useful cavity (cavities) 230 in the main plane (x, y); these lateral dimensions can vary from a few tens of microns to a few hundred microns, or a few millimeters. The defining step also depends on the spacing between useful cavities that is required for the device 200: this spacing can, for example, vary from a few tens of microns to a few hundred microns, or a few millimeters.

It will be noted that this defining step and the subsequent steps can be preferentially performed by the device manufacturer, the substrate manufacturer being only responsible for providing the generic structure 100. Alternatively, the substrate manufacturer can implement the defining step at the request of the client and according to specifications set by the latter.

The fabricating process according to the disclosure then comprises a step of removing partitions 24 located inside the contour of the group 23g of elementary cavities 23; the partitions will be called temporary partitions 24g hereafter.

The removal of the temporary partitions 24g advantageously comprises the local etching of the superficial layer 10 in order to form at least one aperture 13 passing through the superficial layer 10, in the defined region of the group 23g of elementary cavities (FIGS. 2A and 2B).

Such local etching may be carried out by photolithography and dry or wet chemical etching. In particular, a mask (not represented) deposited on the free side 12' of the superficial layer 10 makes it possible to delimit the regions to be etched in order to form the apertures 13, and to protect the rest of the free surface 12'. It will be noted that alignment marks, defined on the periphery of the carrier substrate 20 and/or in regions provided for cutting lanes on the first side 21 thereof and/or at the second side 22 thereof, during the formation of the elementary cavities 23 and of the partitions 24 on the carrier substrate 20, allow a precise positioning to be achieved with respect to the partitions 24 and buried elementary cavities 23 during this removing step. These marks can also be used for subsequent steps requiring an alignment with respect to the useful cavity (cavities) 230 of the device 200.

According to a first variant, illustrated in FIG. 2B, the (at least one) aperture 13 is made plumb with the temporary partitions 24g.

According to a second variant, which can be used, in particular, for the first embodiment of the disclosure, the aperture 13 is formed plumb with at least one of the elementary cavities 23 of the group 23g of elementary cavities (which is not represented).

For the aforementioned variants, it is possible to re-plug the (at least one) aperture 13, for example, by depositing polycrystalline silicon, under vacuum or in a controlled atmosphere.

According to a third variant (not represented), removing the temporary partitions 24g may comprise forming at least one aperture 13 by local etching the second side 22 of the carrier substrate 20, up to the cavities of the group 23g of elementary cavities 23. Advantageously, such etching at the second side 22 is carried out at the end of the fabrication of the MEMS device 200, in particular, when the carrier substrate 20 is thinned, for example, to 400, 200, 100, 50 microns or less. This allows an aperture 13 of small size to be produced while remaining within ratios of etched thickness/dimensions of the aperture that are accessible using known chemical etching techniques. It will be noted that this variant allows the membrane (portion of the superficial layer 10 located plumb with the group 23g of elementary cavities 23) to be left intact by avoiding passage of the aperture 13 therethrough.

In either of the stated variants, a dry or wet chemical etching suitable for attacking the material of the partitions 24 is then performed, via the aperture 13, in order to eliminate the temporary partitions 24g (FIGS. 1D and 5D) and free up the superficial layer 10 (forming the membrane 210) across the entire useful cavity 230.

At the end of the step for removing the temporary partitions 24g, a device 200 including a membrane 210 overhanging a useful cavity 230 (FIG. 1E) is obtained.

The fabricating process according to the disclosure for this device 200 is simplified by the use of a so-called generic structure 100, which does not require, during the development thereof, knowledge of the geometry and of the distribution of the useful cavities 230. The generic structure 100 includes a plurality of elementary cavities 23 and a plurality of partitions 24, some of which 24g are temporary since they are intended to be eliminated, in order to form one (or more) useful cavity (cavities) 230 defined from one (or more) group (groups) 23g of elementary cavities.

In the first embodiment of the disclosure, in which the generic structure 100 comprises elementary cavities 23 separated from one another by the partitions 24, the membrane 210 located above the useful cavity 230 following the removal of the temporary partitions 24g is held over the entire perimeter thereof by partitions 24 (FIGS. 1D and 1E). In the second embodiment of the disclosure, in which the partitions 24 of the generic structure 100 do not mutually separate the elementary cavities 23, the membrane 210 located above the useful cavity 230 following the removal of the temporary partitions 24g is held locally over the perimeter thereof by partitions 24 (FIGS. 5D and 5E). Either of the embodiments can be envisaged depending on the type of intended device 200.

The generic structure 100 therefore has the advantage of being able to be used to fabricate a multitude of devices 200 based on varied topologies of useful cavities 230, which can be formed from a group 23g of elementary cavities 23.

Moreover, the development of the useful cavity 230 by removing the temporary partitions 24g is advantageous in that it only requires a small elimination of material, the partitions having a reduced width, and this limits the etching time and makes it possible to achieve precise dimensions for the useful cavity 230.

The fabricating process (irrespective of the embodiment) can also comprise additional steps for fabricating the device 200 on the superficial layer 10 and, in particular, on the membrane 210 and at the periphery thereof. These additional steps can notably comprise steps of photolithography, etching and depositing insulating and/or electrically conductive layers in order to define and form, for example, electrodes 220, above each membrane 210 (FIG. 1F).

It will be noted that these additional steps can alternatively be performed before the step for removing the temporary partitions 24g, in order to utilize the mechanical strength of the superficial layer 10 as a result of the underlying temporary partitions 24g, across (in the main plane (x, y)) the entire generic structure 100.

According to an advantageous mode of implementing embodiments of the disclosure, the step for providing the generic structure 100 firstly comprises providing a donor substrate 1, as shown in FIG. 3a. The donor substrate 1 has a front side 11, intended to be joined to the carrier substrate 20 and a back side 12. By way of example, and in a nonlimiting manner, the donor substrate 1 will possibly comprise at least one semiconductor, for example, silicon, silicon carbide, etc., or a piezoelectric material, for example, lithium tantalate, lithium niobate, aluminum nitride, zinc oxide, PZT, etc.

Secondly, the step for providing the generic structure 100 comprises providing the carrier substrate 20 including a first side 21 (shown in FIG. 3b), intended to be joined to the donor substrate 1, and a second side 22. The carrier substrate further includes the elementary cavities 23 opening at the first side 21 and partitions 24, the upper surface of which forms all or part of the first side 21.

By way of nonlimiting example, the carrier substrate 20 can comprise silicon, glass, sapphire, etc.

The shape of the elementary cavities 23 in the main plane (x, y) can be circular, square, rectangular or polygonal. The lateral dimensions of the elementary cavities 23 in the main plane (x, y) are advantageously less than 50 microns, or less than 25 microns, or less than 10 microns. The spacing between elementary cavities 23, corresponding to the width of the partitions 24, can vary from one micron to a few tens of microns. By way of example and in a nonlimiting manner, the width of the partitions 24 can be approximately 5 microns, 7 microns, 10 microns or 15 microns. The upper surface of the partitions 24 can have a circular, square, rectangular or polygonal shape.

The depth of the elementary cavities 23, along the z-axis normal to the main plane (x, y) (also corresponding to the height of the partitions 24) can vary from a few tens of nanometers to a few tens of microns, or a few hundred microns, depending on the intended device 200.

Thirdly, the step for providing the generic structure 100 comprises joining the front side 11 of the donor substrate 1 and the first side 21 of the carrier substrate 20 as shown in FIG. 3b. The joining operation preferentially comprises direct bonding by molecular adhesion. The principle of molecular adhesion, which is well known in the prior art, will not be described in further detail here. It will be noted that the substrates to be joined must have a very good surface finish (cleanness, low roughness, etc.) for a joint of good quality to be obtained.

Advantageously, in order to guarantee a joint of good quality, the joining step comprises cleaning the to-be-joined surfaces of the donor substrate 1 and of the carrier substrate 20, before the surfaces are brought into contact. By way of example, a conventional sequence used in microelectronics, especially for silicon-based substrates, comprises an ozone clean, an SC1 clean (SC1 being the acronym of Standard Clean 1) and an SC2 clean (SC2 being the acronym of Standard Clean 2) with intermediate rinses. The surfaces to be joined will also possibly be activated, for example, using a plasma, before being brought into contact, in order to promote a high bonding energy between the surfaces.

Optionally, the donor substrate 1 and/or the carrier substrate 20 will possibly comprise a bonding layer, on the front side 11 and/or on the first side 21, respectively, in order to promote bond quality and the bonding energy of their interface.

Fourthly, the step for providing the generic structure 100 comprises the thinning of the donor substrate 1 so as to form the superficial layer 10, as illustrated in FIG. 3c.

According to a first variant of this advantageous mode of implementation, the thinning of the donor substrate 1 is carried out by mechanical grinding, by chemical-mechanical polishing and/or by chemical etching at the back side 12 thereof. At the end of the thinning step, the superficial layer 10 arranged on the carrier substrate 20 and having a thinned free side 12' is obtained (FIG. 1A).

According to this variant, the thickness of the superficial layer 10 can be between a few microns and several tens, or hundreds of microns.

According to a second variant of this advantageous mode of implementation, the thinning is carried out using the SMART CUT® process, which is based on an implantation of light ions and a detachment at the implanted region.

Thus, according to this second variant, the aforementioned step of providing the donor substrate 1 comprises implanting light species in the donor substrate 1, so as to form a buried fragile region 2 that lies between a first portion 3 of the donor substrate, which portion is intended to form the superficial layer 10, and a second portion 4 of the donor substrate 1, which portion is intended to form the rest of the donor substrate (FIG. 3A). Preferentially, an intermediate layer 5 is arranged on the front side 11 of the donor substrate 1, before the implantation. This intermediate layer 5 can be retained, removed and/or replaced by a bonding layer prior to the joining step.

The thickness of the first portion 3 and, therefore, of the future superficial layer 10, is dependent on the implantation energy of the light species (hydrogen or helium, for example). Advantageously, the implantation energy is chosen so that the first portion 3 of the donor substrate 1 has a thickness of about 0.2 micron-2 microns.

The donor substrate 1 is then joined to the carrier substrate 20 in accordance with the joining step of the process (FIG. 3B).

Still according to this second variant, the step of thinning the donor substrate 1 comprises separating, at the buried fragile region 2, the superficial layer 10 (formed by the detached first portion 3) and the second portion 4 of the donor substrate 1 (FIG. 3C). This separation preferably occurs during a heat treatment at a temperature between a few hundred degrees and 700° C. It may alternatively be mechanically assisted or achieved after the heat treatment, by means of a mechanical stress.

At the end of the thinning step, the superficial layer 10 transferred to the carrier substrate 20 is obtained (FIG. 3C). It will be recalled that the SMART CUT® process allows thin layers having an excellent thickness uniformity to be obtained.

In certain cases where the thickness of the superficial layer 10 transferred using the SMART CUT® process is insufficient, it is possible to again increase this thickness by depositing an additional layer on the free surface 12' of the superficial layer 10, for example, by epitaxial growth or other known deposition processes, during a finishing processing that is mentioned below.

In both the thinning variants described above, when the superficial layer 10 is arranged on the carrier substrate 20, the thinning step may comprise finishing processing aiming to improve the crystal quality (removal of defects from the layer), the surface quality (removal of residual roughness from the free surface 12') and/or to modify the thickness of the superficial layer 10. This finishing processing will possibly include one or more heat treatments, chemical-mechanical polishes, chemical etches, epitaxial growth, and/or deposition of additional layers.

Example of Implementation

In the present example, the intended device 200 requires a silicon membrane 210 having a thickness of 1.5 microns overhanging a useful cavity 230 with a square shape of approximately 104 microns per side and one micron in depth.

The fabricating process according to the disclosure first proposes the provision of a generic structure 100 including a silicon superficial layer of 1.5 microns and elementary cavities 23 with a square shape of 20 microns per side, one micron in depth and spaced apart by 8 microns.

The donor substrate 1 is a substrate made of silicon (FIG. 4A). A silicon oxide layer 5, for example, of about 100 nm, is formed (for example, by thermal oxidation) on the front side 11 prior to the implantation of the light species. The implantation energy is set to 210 keV, with hydrogen species at a dose of 7E16/cm2. Thus, a buried fragile region 2 is formed, which lies in the main plane (x, y) between a first portion 3 and a second portion 4 of the donor substrate 1 and located at a depth of approximately 1.9 microns.

The silicon oxide layer 5 will possibly be preserved or removed prior to the step of joining to the carrier substrate 20.

The carrier substrate 20 is a substrate made of silicon. A thermal-oxide layer 24a having a thickness of 2 microns is formed on the carrier substrate 20. This thermal-oxide layer 24a is formed on the first side 21 and the second side 22 of the carrier substrate 20. The thermal-oxide layer present on the second side 22 will possibly be entirely or partially preserved or removed depending on the circumstances. Alternatively, an oxide layer will possibly be deposited (using a known deposition technique) solely on the first side 21 of the carrier substrate 20.

By photolithography, a mask 25 is then defined on the first side 21 of the carrier substrate 20, including unmasked regions at which the thermal-oxide layer 24a will be able to be etched and masked regions at which the thermal-oxide layer 24a will be protected (FIG. 4B). It will be noted that alignment marks are also defined on the periphery of the carrier substrate 20 and/or in regions of the cutting lanes, for the subsequent photolithography steps that will be aimed at re-determining the coordinates of the elementary cavities 23, when they are buried under the superficial layer 10.

The unmasked regions are defined according to the size and the target planar distribution of the elementary cavities 23 of the generic structure 100. At these unmasked regions, dry or wet chemical etching of the thermal-oxide layer 24a is carried out right through the thickness thereof, i.e., 2 microns (FIG. 4C). The mask 25 is then removed (FIG. 4D).

Typically, in this example, each elementary cavity 23 measures 20 microns per side, and partitions 24 distributed in a grid, of 8 microns in width, separate the elementary cavities 23 from one another (FIG. 4E).

After a cleaning and activating sequence, the front side 11 of the donor substrate 1 and the first side 21 of the carrier substrate 20 are brought into contact and bonded by molecular adhesion (FIG. 4F). It will be noted that the direct bonding will possibly be carried out under ambient atmosphere or under a controlled atmosphere (pressure and nature of the gas). An anneal for consolidating the bonding interface may be applied to the bonded structure at a temperature of about 350° C.

The separation via the buried fragile region 2 is carried out during a detaching heat treatment, at a temperature of about 500° C.

This then results in the generic structure 100, comprising the superficial layer 10 arranged on the plurality of elementary cavities 23 of the carrier substrate 20 (FIG. 4G).

Finishing processing operations, such as a thermal oxidizing process and a chemical-mechanical polish are preferably carried out in order to guarantee that the transferred superficial layer 10 has a good surface and structural quality and to obtain a thickness of 1.5 microns.

The step for defining at least one group 23g of adjacent elementary cavities 23, the outer contour of which, in the main plane, corresponds to a contour of the useful cavity 230, is then carried out. As illustrated in FIG. 4H, a group 23g of sixteen elementary cavities 23 is defined in order to form a useful cavity 230 of approximately 104 microns per side. The partitions separating these sixteen elementary cavities 23 are the temporary partitions 24g intended to be eliminated during the next step of the fabricating process.

For the step of removing the temporary partitions 24, a mask 14, for example, made of silicon nitride, is defined by photolithography, using the alignment marks provided on the carrier substrate 20, in order to delimit unmasked regions at which the apertures 13 passing through the superficial layer 10 will be formed, the rest of the free side 12 of the superficial layer 10 being masked and therefore protected. Dry or wet local etching of the superficial layer 10 made of silicon is carried out in order to form the apertures 13, the cross-sectional area of each aperture 13 here being chosen to be smaller than the upper surface of the temporary partitions 24g (FIG. 4I) and being positioned at intersections of the grid forming the temporary partitions 24g.

In the presence of the apertures 13, a chemical etch, for example, a dry chemical etch, based on hydrofluoric acid (HF) vapors, is carried out to remove the thermal oxide from which the temporary partitions 24g are made, and thus free up the superficial layer 10 across the entire useful cavity 230 in order to form the membrane 210.

The mask 14 may be removed, before the chemical etching of the temporary partitions 24g or at the end of the step of removing the temporary partitions 24g.

It will be noted that, depending on the process chosen for the step of removing the temporary partitions 24g, over-etching can be carried out at the partitions 24 defining the useful cavity 230, and therefore substantially modify the dimensions of the useful cavity 230 and of the associated membrane 210. It will therefore be necessary to take into account these potential effects of over-etching and/or adapt the process chosen for the step of removing the temporary partitions 24g, to obtain a useful cavity 230 with the right dimensions.

The apertures 13 may then be re-plugged if necessary.

This results in the intended device 200, including a membrane 210 overhanging a useful cavity 230, and the thickness of the superficial layer 10 (membrane 210) and the geometry of the useful cavity 230 are compliant with the specifications set out above.

Of course, the present disclosure is not limited to the described modes of implementation and examples, and variant embodiments may be introduced thereinto without departing from the scope of the invention as defined by the claims.

The invention claimed is:

1. A method of fabricating a device including a membrane overhanging a useful cavity, the method comprising:
   providing a generic structure including a superficial layer extending in a main plane and arranged on a first side of a carrier substrate, the carrier substrate including elementary cavities opening under the superficial layer and partitions delimiting each elementary cavity, the partition having upper surfaces that form all or some of the first side of the carrier substrate;
   defining a group of adjacent elementary cavities, such that a contour of the group of adjacent elementary cavities corresponds, in the main plane, to a contour of the useful cavity; and
   removing the partitions located inside the contour of the group of adjacent elementary cavities, to form the useful cavity, and to free up the superficial layer arranged above the useful cavity and making up the membrane.

2. The method of claim 1, wherein the partitions separate the elementary cavities from one another.

3. The method of claim 1, wherein the partitions are distributed in the main plane according to a network of partitions allowing communication between the elementary cavities, each elementary cavity being delimited by an elementary pattern of the network of partitions.

4. The method of claim 1, wherein providing the generic structure comprises:
   providing a donor substrate;
   providing the carrier substrate including the opening elementary cavities, and the partitions delimiting each elementary cavity and the upper surfaces of which form all or some of the first side of the carrier substrate;

joining the donor substrate and the carrier substrate at the first side of the carrier substrate; and thinning the donor substrate so as to form the superficial layer.

5. The method of claim 4, wherein:

providing the donor substrate comprises implanting light species in the donor substrate, so as to form a buried fragile region that lies between a first portion of the donor substrate, which first portion is intended to form the superficial layer, and a second portion of the donor substrate, which second portion is intended to form the rest of the donor substrate; and thinning the donor substrate comprises separating, via the buried fragile region, the superficial layer from the second portion of the donor substrate.

6. The method of claim 5, wherein the first portion of the donor substrate has a thickness between 0.2 micron and 2 microns.

7. The method of claim 4, wherein the joining comprises bonding the donor substrate to the first side of the carrier substrate by molecular adhesion.

8. The method of claim 1, wherein removing the partitions located inside the contour of the group of elementary cavities comprises local etching of the superficial layer to form at least one aperture passing through the superficial layer, and chemical etching of the partitions via the at least one aperture.

9. The method of claim 8, further comprising forming the at least one aperture plumb with at least one partition of the partitions.

10. The method of claim 8, further comprising forming an aperture plumb with each elementary cavity of the group of adjacent elementary cavities.

11. The method of claim 1, wherein removing the partitions located inside the contour of the group of adjacent elementary cavities comprises local etching of a second side of the carrier substrate to form at least one aperture opening into one cavity of the group of adjacent elementary cavities, and chemical etching of the partitions via the at least one aperture.

12. The method of claim 1, wherein the partitions comprise at least one material chosen from among silicon oxide, silicon nitride, single-crystal silicon, polycrystalline silicon, amorphous silicon or porous silicon.

13. The method of claim 1, wherein the membrane comprises at least one semiconductor or piezoelectric material.

14. A method of fabricating a MEMS device, comprising:

providing a structure including a planar layer on a surface of a carrier substrate, the surface of the carrier substrate having elementary cavities therein located under the planar layer and partitions delimiting each elementary cavity, the partitions having upper surfaces that form all or a portion of the surface of the carrier substrate;

forming at least one aperture through the planar layer; and removing some of the partitions located inside a contour of a group of adjacent elementary cavities and forming a useful cavity without removing at least some of the partitions located outside the contour, and freeing a portion of the planar layer suspended over the useful cavity, the portion of the planar layer defining a membrane of the MEMS device.

15. The method of claim 14, wherein the partitions separate the elementary cavities from one another.

16. The method of claim 14, wherein the partitions are distributed in a plane parallel to the planar layer according to a network of partitions allowing communication between the elementary cavities, each elementary cavity being delimited by an elementary pattern of the network of partitions.

17. The method of claim 14, wherein removing some of the partitions located inside the contour of the group of elementary cavities comprises chemical etching of the some of the partitions using an etchant introduced through the at least one aperture formed through the planar layer.

18. The method of claim 14, further comprising forming the at least one aperture through the planar layer at a location plumb with at least one of the partitions.

19. The method of claim 14, wherein the partitions comprise at least one material chosen from among silicon oxide, silicon nitride, single-crystal silicon, polycrystalline silicon, amorphous silicon or porous silicon.

20. The method of claim 14, wherein the planar layer comprises at least one semiconductor or piezoelectric material.

* * * * *